(12) United States Patent
Louie et al.

(10) Patent No.: US 10,115,446 B1
(45) Date of Patent: Oct. 30, 2018

(54) SPIN TRANSFER TORQUE MRAM DEVICE WITH ERROR BUFFER

(71) Applicant: SPIN TRANSFER TECHNOLOGIES, INC., Fremont, CA (US)

(72) Inventors: Benjamin Stanley Louie, Fremont, CA (US); Neal Berger, Cupertino, CA (US)

(73) Assignee: SPIN TRANSFER TECHNOLOGIES, INC., Fremont, CA (US)

(*) Notice: Subject to any disclaimer, the term of this patent is extended or adjusted under 35 U.S.C. 154(b) by 106 days.

(21) Appl. No.: 15/132,544

(22) Filed: Apr. 19, 2016

Related U.S. Application Data

(60) Provisional application No. 62/150,804, filed on Apr. 21, 2015.

(51) Int. Cl.
| | | |
|---|---|---|
| *G06F 11/00* | (2006.01) | |
| *G11C 11/16* | (2006.01) | |
| *G06F 3/06* | (2006.01) | |
| *G06F 11/07* | (2006.01) | |

(52) U.S. Cl.
CPC ........ *G11C 11/1675* (2013.01); *G06F 3/0619* (2013.01); *G06F 3/0653* (2013.01); *G06F 3/0688* (2013.01); *G06F 11/076* (2013.01); *G06F 11/0727* (2013.01); *G11C 11/1653* (2013.01); *G11C 11/1673* (2013.01)

(58) Field of Classification Search
CPC .................................................. G06F 11/1068
See application file for complete search history.

(56) References Cited

U.S. PATENT DOCUMENTS

| | | | | |
|---|---|---|---|---|
| 6,064,948 | A | * | 5/2000 | West ............... G01B 31/318307 702/119 |
| 6,731,537 | B2 | * | 5/2004 | Kanamori ............... G11C 16/10 365/185.08 |
| 7,386,765 | B2 | * | 6/2008 | Ellis ..................... G06F 11/1044 710/52 |
| 8,255,742 | B2 | | 8/2012 | Ipek et al. |
| 8,386,836 | B2 | * | 2/2013 | Burger .................. G06F 11/073 714/42 |
| 8,456,926 | B2 | | 6/2013 | Ong et al. |
| 8,539,303 | B2 | | 9/2013 | Lu et al. |
| 8,625,339 | B2 | | 1/2014 | Ong |
| 8,966,345 | B2 | | 2/2015 | Wilkerson et al. |
| 9,026,888 | B2 | | 5/2015 | Kwok |
| 9,043,674 | B2 | | 5/2015 | Wu et al. |

(Continued)

OTHER PUBLICATIONS

Helia Naeimi, et al.; "STTRAM Scaling and Retention Failure"; Intel technology Journal, vol. 17, Issue 1, 2013; pp. 54-75 (22 pages).

*Primary Examiner* — Christopher S McCarthy

(57) ABSTRACT

A nonvolatile error buffer is added to STT-MRAM memory design to reduce the error correction coding ECC required to achieve reliable operation with a non-zero Write Error Rate ("WER"). The error buffer is fully associative, storing both the address and the data of memory words which have failed to write correctly within an assigned ECC error budget. The write cycle includes a verify to determine if the word has been written correctly. The read cycle includes a search of the error buffer to determine if the address is present in the buffer.

22 Claims, 9 Drawing Sheets

(56) References Cited

U.S. PATENT DOCUMENTS

| | | |
|---|---|---|
| 9,104,595 B2 | 8/2015 | Sah |
| 9,229,853 B2 | 1/2016 | Khan et al. |
| 9,250,990 B2 | 2/2016 | Motwani et al. |
| 9,298,552 B2 | 3/2016 | Leem et al. |
| 9,299,412 B2 | 3/2016 | Naeimi et al. |
| 9,317,429 B2 | 4/2016 | Ramanujan et al. |
| 9,418,721 B2 | 8/2016 | Bose et al. |
| 2004/0221030 A1* | 11/2004 | Huras ............... G06F 17/30368 709/224 |
| 2005/0160205 A1* | 7/2005 | Kuo .................... G06F 13/423 710/36 |
| 2006/0198202 A1* | 9/2006 | Erez .................... G11C 11/005 365/185.29 |
| 2007/0094573 A1* | 4/2007 | Chen ................. G11B 20/1816 714/769 |
| 2011/0283135 A1* | 11/2011 | Burger ................ G06F 11/073 714/6.1 |
| 2012/0155158 A1 | 6/2012 | Higo et al. |
| 2012/0221905 A1* | 8/2012 | Burger ................ G06F 11/073 714/723 |
| 2012/0239969 A1* | 9/2012 | Dickens .............. G06F 11/073 714/6.13 |
| 2015/0100848 A1* | 4/2015 | Kalamatianos ..... G06F 11/1008 714/764 |
| 2015/0206568 A1 | 7/2015 | Bose et al. |
| 2015/0278011 A1 | 10/2015 | Keppel et al. |
| 2015/0378814 A1 | 12/2015 | Webb et al. |
| 2015/0380088 A1 | 12/2015 | Naeimi et al. |
| 2016/0085443 A1 | 3/2016 | Tomishima et al. |
| 2016/0085621 A1 | 3/2016 | Motwani et al. |
| 2016/0085692 A1 | 3/2016 | Kwok |

\* cited by examiner

SPIN TRANSFER TORQUE MRAM DEVICE WITH ERROR BUFFER

CROSS-REFERENCE TO RELATED APPLICATION

This application claims the benefit of Provisional Application No. 62/150,804, filed Apr. 21, 2015. Priority to this provisional application is expressly claimed, and the disclosure of the provisional application is hereby incorporated herein by reference in its entirety.

FIELD

The present patent document relates generally to random access memory (RAM) and, more particularly, to an error buffer that is added to RAM memory devices to reduce or eliminate the error correction coding ("ECC") required to achieve reliable operation with a non-zero write error rate ("WER"). The methods and devices described herein are particularly useful in spin-transfer torque magnetic memory (STT-MRAM) devices.

BACKGROUND

Magnetoresistive random-access memory ("MRAM") is a non-volatile memory technology that stores data through magnetic storage elements. These magnetic storage elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0." One important feature of MRAM devices is that they are generally considered as non-volatile memory devices, since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices. Spin transfer torque magnetic random access memory ("STT-MRAM") has an inherently stochastic write mechanism, wherein bits have certain probability of write failure on any given write cycle. The write failures are most generally random, and have a characteristic failure rate. A high WER may make the memory unreliable.

In memory devices, error correction is commonly used to achieve reliable write performance and to reduce post-ECC failure rates to acceptable levels. Error correction coding requires extra memory in the array to store parity bits. The requirement for additional memory may cause a significant increase in memory array size, and/or reduction of memory capacity for the devices having an inherently high WER such as STT-MRAM, either of which are highly undesirable. Further the ECC encoder/decoder circuits may be complex, large, slow, and use a great deal of power when active.

Thus, there is a need for a technology that can be used with STT-MRAM to ensure reliable write performance with low ECC failure rates, even with devices that have inherently high WER.

SUMMARY

In an embodiment, a memory device is disclosed. In one aspect, the memory device is a random access memory (RAM) device. The device comprises a memory array comprised of MRAM storage elements arranged as a plurality of data words. In an embodiment, each of the plurality of data word has an address. The device further can include address and data lines, coupled to the memory array, that carry a data word to be written into the MRAM storage elements of the memory array and an address for the data word. The device can also have a write buffer block, coupled to the address and data lines, comprised of a sufficient number of storage elements such that the write buffer block stores the data word and the address carried on the address and data lines during every write cycle. The device can also have an error buffer block, coupled to the address and data lines, which is comprised of a plurality of buffer entries. Each of the buffer entries can comprise a plurality of storage elements and an associated buffer memory address. The device can also include a memory control logic block that operates during a read cycle and the write cycle. During the write cycle, the memory control logic block determines whether the data word was written into the memory array within a predefined error budget. The memory control logic block writes the data word and the addresses of the data word into a selected one of the plurality of buffer entries of the error buffer block if the data word was not written into the memory array within the predefined error budget. During a read cycle, the memory control logic block can determine whether the address to be read is stored in the write buffer block, the error buffer block or the memory array.

In an embodiment of the device, the write buffer block comprises a plurality of storage elements. The number of storage elements corresponds to how many bits are in the data word and how many bits are in the address of the data word to be written. In an embodiment of the device, each of the plurality of storage elements of the write buffer block comprises a latch. In another embodiment, each of the plurality of storage elements of the write buffer block comprises a static random access memory cell.

In an embodiment, the memory control logic block of the device includes an address selection block that determines which of the buffer entries in the error buffer block will store the data word and the address of the data word. In an embodiment, the address selection block can comprise a buffer address selection logic block that determines which of the plurality of buffer entries in the error buffer block will store the data word and the address of the data word. In yet another embodiment, the buffer address selection logic block selects one of the plurality of buffer entries having the lowest value for the buffer memory address. In another embodiment, the buffer address selection logic block selects one of the plurality of buffer entries having the highest value for the buffer memory address.

In another embodiment, the buffer address selection logic block of the device tracks the number of write cycles experienced by each of the plurality of storage elements in the error buffer. In an embodiment, the buffer address selection block can select one of the plurality of buffer entries having fewer write cycles as compared to other of the plurality of buffer entries.

In another embodiment, the address selection block of the device keeps track of which of the plurality of buffer entries has data stored therein. In an embodiment, the address selection block will select one of the plurality of buffer entries that does not have data stored therein for storing the data word and the address of the data word.

In an embodiment, each of the plurality of storage elements of the error buffer block can comprise MRAM memory cells. In another embodiment, each of the plurality of storage elements of the error buffer block can comprise flash memory cells. In yet another embodiment, each of the plurality of storage elements of the error buffer block can comprise volatile memory cells.

Also described herein is a method for writing data into a memory device comprising a plurality of memory cells, with each of the memory cells being arranged to store a data word at one of a plurality of memory addresses. The method can include writing the data word into the memory cells at a selected one of the plurality of memory addresses, thereby storing a written data word in the memory device. The method can also include storing the data word and the selected one of the plurality of memory addresses in a write buffer block. The method can also include reading the written data word. The method can also include comparing the data word that was to be written during the writing step to the written data word that was read during the reading step. The method can also include determining whether any differences between the data word that was to be written during the writing step and the written data word that was read during the reading step are within an allowable error budget. The method can also include writing the data word and the selected one of the plurality of memory addresses to a selected one of a plurality of buffer entries within an error buffer block, if the written data word is not within the predetermined error budget.

In an embodiment of the method, the writing the data word to a selected one of a plurality of buffer entries within an error buffer block step can comprise determining which of the plurality of buffer entries is available for storing of the data word, selecting one of the plurality of buffer entries that is available for storing of the data word, and writing the data word into the buffer entry selected during the selecting step.

In an embodiment of the method, the selecting step can comprise determining the number of write cycles memory cells of the plurality of buffer entries within an error buffer block have previously incurred, and writing the data word into a buffer entry containing memory cells that have had fewer write cycles than other of the plurality of buffer entries.

In an embodiment of the method, the writing the data word to a selected one of a plurality of buffer entries within an error buffer block step comprises determining which of the plurality of buffer entries is available for storing of the data word, selecting one of the plurality of buffer entries that has a numerical address value that is higher than any other numerical address value of the plurality of buffer entries that is available for storing of the data word, and writing the data word into the buffer entry selected during the selecting step.

In an embodiment of the method, if the written data word is within the predetermined error budget, the method comprises clearing any data word written into a particular buffer entry corresponding to the selected one of the plurality of memory addresses.

In an embodiment of the method, the method also comprises receiving a read request, the read request including a read address, determining whether the read address matches the selected one of the plurality of memory addresses stored in the write buffer block, determining whether the read address matches the selected one of the plurality of memory addresses stored in any of the plurality of buffer entries within the error buffer block, outputting the data word stored in the write buffer block if the read address matches the selected one of the plurality of memory addresses stored in the write buffer block. A method can also include outputting the data word stored within the selected one of a plurality of buffer entries within an error buffer block if the read address does not match the selected one of the plurality of memory addresses stored in the write buffer block, but does match the selected one of the plurality of memory addresses stored in any of the plurality of buffer entries within the error buffer block. A method can also include outputting the data word stored within the memory cells at the read address if the read address does not match either the selected one of the plurality of memory addresses stored in the write buffer block or the selected one of the plurality of memory addresses stored in any of the plurality of buffer entries within the error buffer block.

In an embodiment of the method, the method can comprise writing the data word stored in the selected one of the plurality of buffer entries into the memory cells of the memory device at the selected one of the plurality of memory addresses when a first portion of the memory device is not undergoing either a write cycle or a read cycle.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
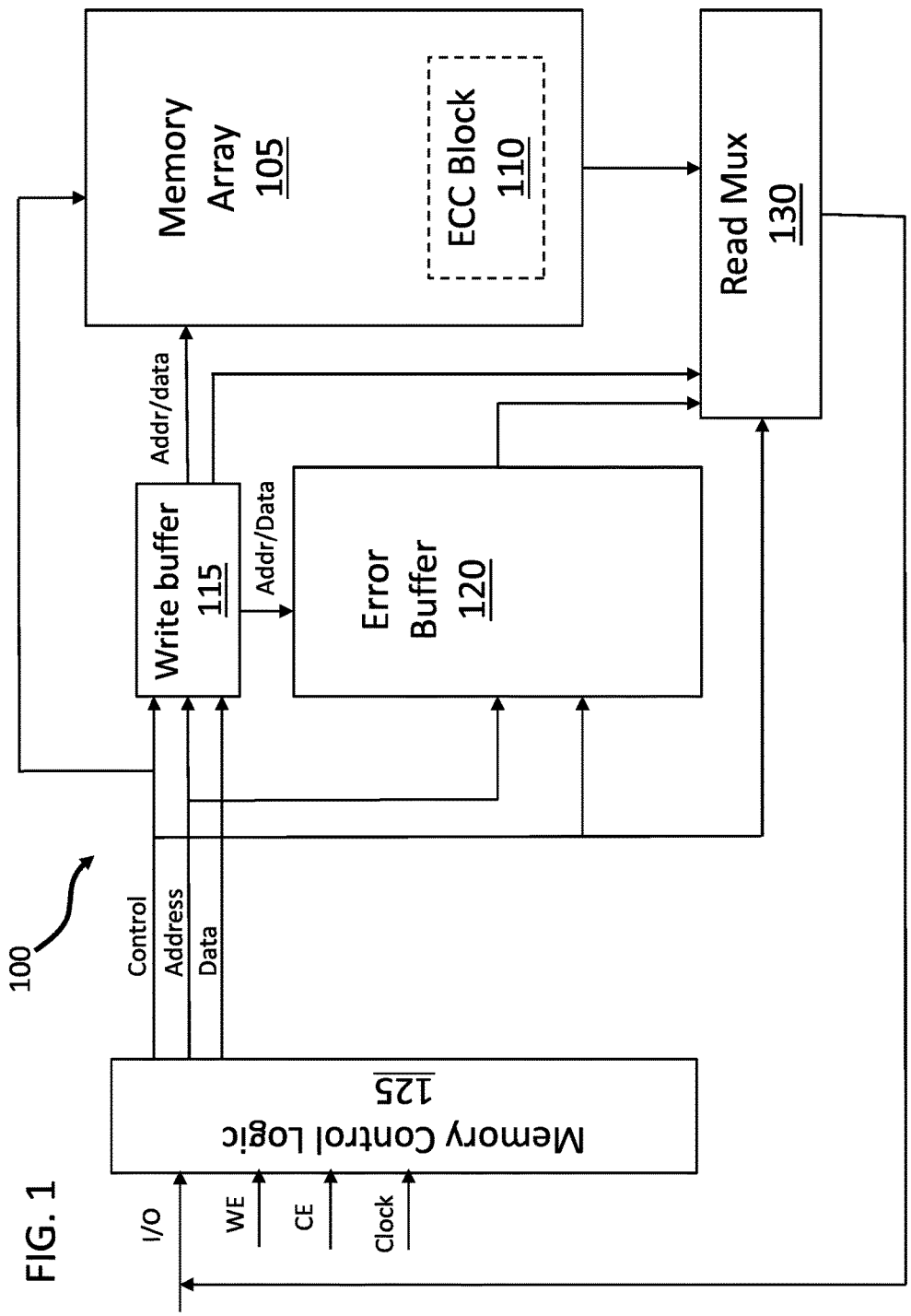
FIG. 1 is a block diagram of an STT-MRAM device with an error buffer memory block.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a magnetic semiconductor device such as an MRAM device with error correction. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

FIG. 1 is a block diagram of an memory device 100 described herein that includes an array of memory cells 105, error correcting code ("ECC") block 110, write buffer 115, error buffer 120 and memory control logic block 125. ECC block 110 is coupled to (or part of) memory array 105 and comprises circuitry and other elements required to perform ECC on data that will be written into memory array 105, and is generally well understood to persons having ordinary skill in the art. Error buffer 120 and write buffer 115 can be coupled to each other to permit exchange of memory addresses and data, as discussed in more detail below. Error buffer 120 can be manufactured using various volatile and nonvolatile memory technologies, including MRAM, flash memory as well as volatile memory technologies, including DRAM and SRAM. Moreover, certain memory technologies such as MRAM, while normally thought of as nonvolatile, can be tuned to be weakly nonvolatile, in that the MRAM cells would only store data for a certain period of time, e.g., a certain number of hours or months, thereby making them volatile. Note that error buffer 120 need not be located on the same integrated circuit as memory array 105.

Memory array 105 can be comprised of bipolar memory elements. Bipolar memory elements use currents to "write" data to a memory element. Depending on the direction of current flow, a logic high (1) or logic low (0) bit may be written to the memory element. Such bipolar memory devices include MRAM, resistive random-access memory (RRAM), phase-change memory (PCM), among others. For example, RRAM devices utilize memristors as a memory element. Current flowing in one direction may be used to write a logic (1) to the memristor. Current flowing in the opposite direction may be used to write a logic (0) to the memristor.

Write buffer 115 preferably comprises a number of storage elements, e.g., latches, static random access memory (SRAM), registers, etc., sufficient to hold a data word that is to be written to memory array 105 and the address where that data word is to be written. In various embodiments, the data word can also contain ECC bits. Such storage elements can be constructed using static random access memory latches, or other appropriate memory technologies. There should be sufficient number of storage elements to hold the number of bits in a word to be written as well as the number of bits in a write address. In embodiments where the data word also includes ECC bits, write buffer 115 must also have a sufficient number of storage elements to store not only data and address bits, but also ECC bits.

Data words and memory addresses for those data words are supplied to memory control logic block 125 of memory 100 by input/output ("I/O") lines. Internal Address and Data lines couple data words (and ECC bits, if present) and addresses to the write buffer 115. Address lines also couple addresses to error buffer 120, as shown in FIG. 1, for read operations, as will be discussed. Memory control logic block 125 further receives various control signals, e.g., write enable WE, chip enable CE and clock signals. In an embodiment, memory array 105 receives data words and addresses from write buffer block 115. Likewise, error buffer block 120 receives data words and addresses from write buffer block 115. Memory control logic block 125 supplies control signals to memory array 105, write buffer block 115 and error buffer block 120, as is also seen in FIG. 1. As will be seen, error buffer 120 and write buffer 115 operate concurrently with each other and augment the ECC block 110 that would normally be present in any memory device. Memory control logic block 125 can control usage of ECC block 110, write buffer 115 and error buffer 120, and is coupled to each, as seen in FIG. 1. The use of write buffer 115 and error buffer 120 in conjunction with memory 105 provides memory location redundancy, which provides significant increases in data reliability. The manner in which an embodiment of memory control logic block 125 controls writing of data into memory array 105, write buffer block 115 and error buffer block 120 will be discussed in more detail below.

To read data words from write buffer block 115, error buffer block 120 and memory array 105, each are coupled to a read multiplexer 130, which is controlled by memory control logic block 125. Read multiplexer 130 outputs data words through the I/O of memory device 100. The manner in which a read operation is performed when using write buffer block 115, error buffer block 120 and memory array 105 is discussed in more detail below.

Figure 2:
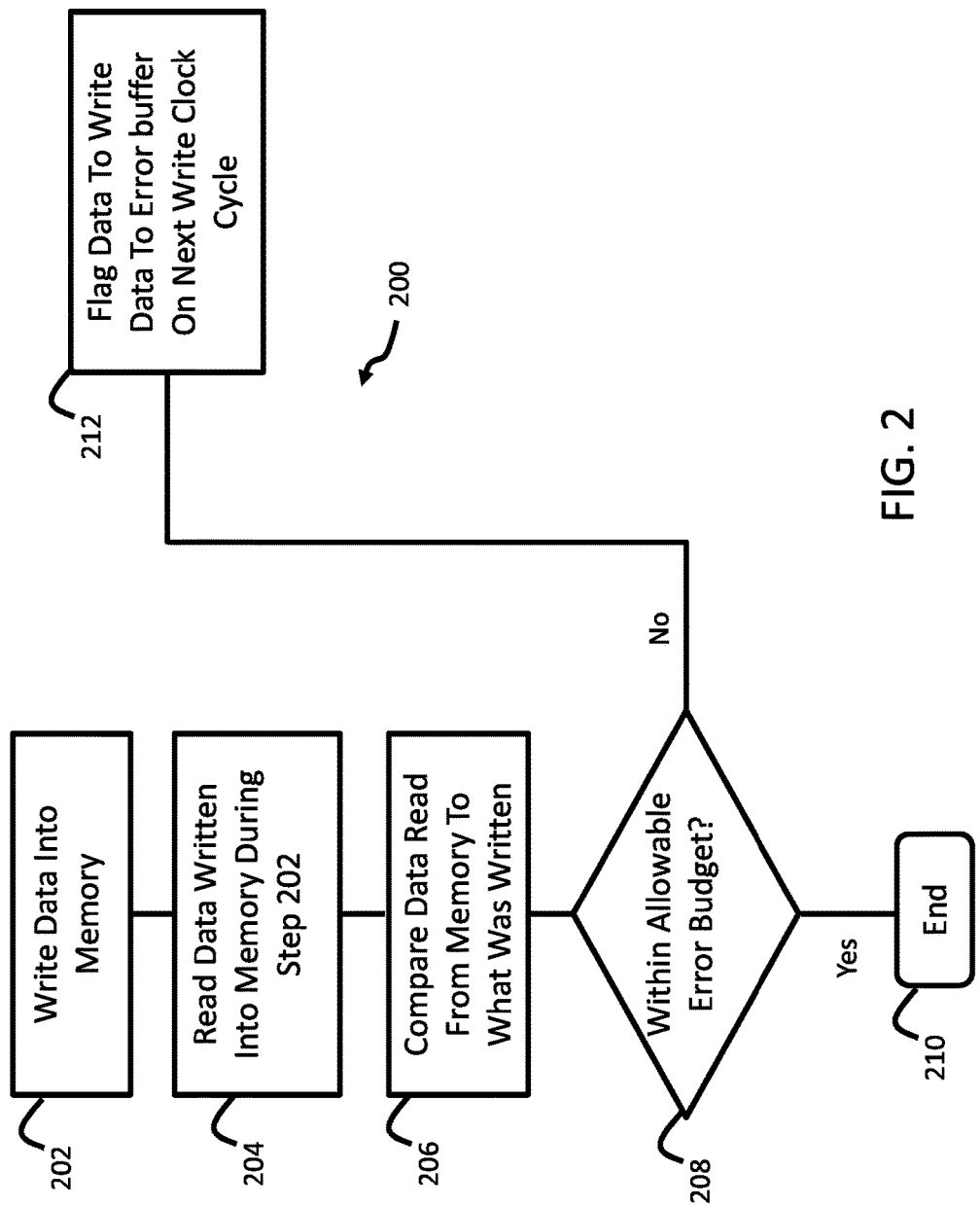
FIG. 2 is a high level flow chart showing the write methodology used in an STT-MRAM device.

FIG. 2 is a flow chart providing an overview an embodiment of a write methodology 200 used in the STT-MRAM device 100 described herein. At step 202, data comprised of memory words are written into memory cells comprising memory array 105. At step 204, the data written during step 204 is read from memory array 105. At step 206, the data (e.g., memory word) that was read from memory array 105 is compared to what was written during step 202. An ECC operation (not shown) can optionally be performed. At step 208, it is then determined whether the comparison falls within a predetermined error budget. A person having ordinary skill in the art will recognize that an error budget represents an allowable number of bit errors for a particular device after error correction. The error budget can be set by the user or by other criteria, but is in any case predetermined. If the number of errors is within the error budget, the process ends at step 210. If, however, during step 206 the number of bit errors for the written memory words exceeds an allowable error budget, the method, at step 212, generates a flag (or equivalent data structure) to write the memory words to error buffer 120 on the next cycle of the clock controlling the device 100.

Figure 3:
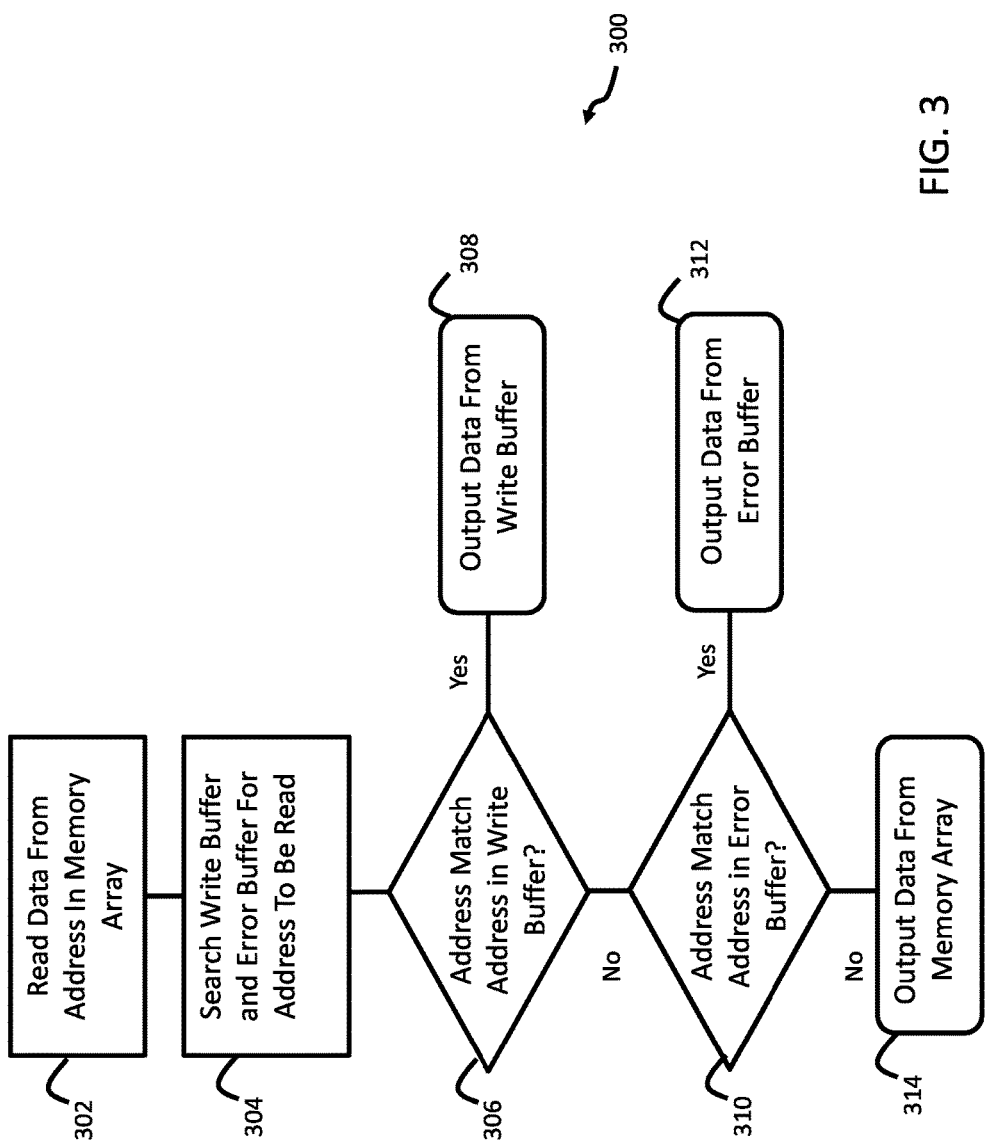
FIG. 3 is a high level flow chart showing the read methodology used in an STT-MRAM device.

FIG. 3 is a flow chart providing an overview of a read methodology 300 using the STT-MRAM device 100 described herein. During a memory read cycle, at step 302, the memory at a particular address within the memory array 105 will be read. At step 304, addresses stored in storage elements of write buffer 115 and error buffer 120 will be searched for the word that is being read. Step 304 can take place either before, during or after performing step 302. If the address to be read matches an address in the write buffer 115 (step 306), the data (e.g., memory words) stored in write buffer 115 will be output (step 308). Likewise, if the address to be read matches an address stored in error buffer 120 (step 310), the data (e.g., memory word) stored therein will be output (step 312). If the address to be read matches neither the address in the write buffer 115 and error buffer 120, data stored for that address in memory array 105 is memory is output as data.

Figure 4A:
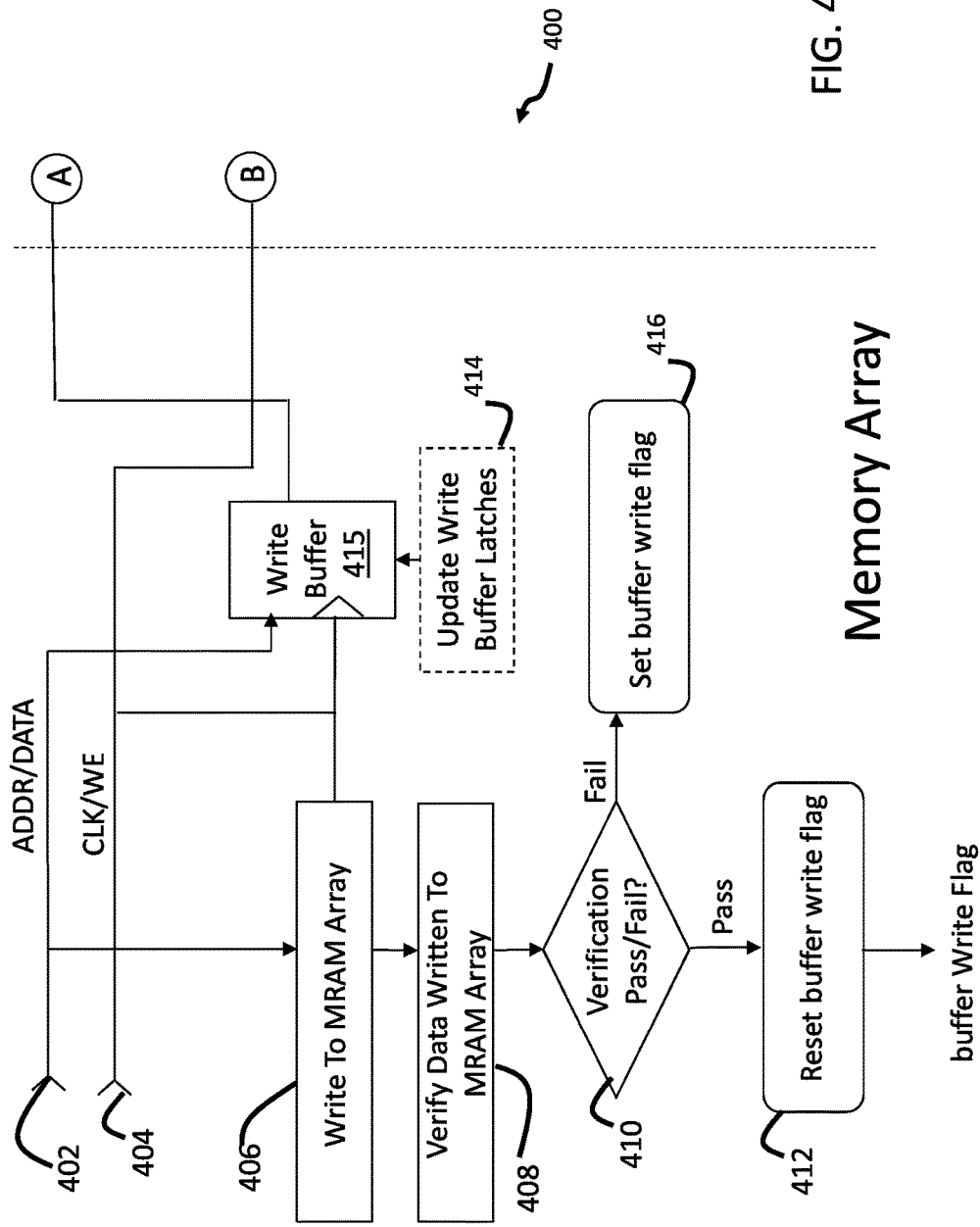
FIGS. 4A and 4B are detailed flow charts showing a write command for an STT-MRAM device using an error buffer.
Figure 4B:
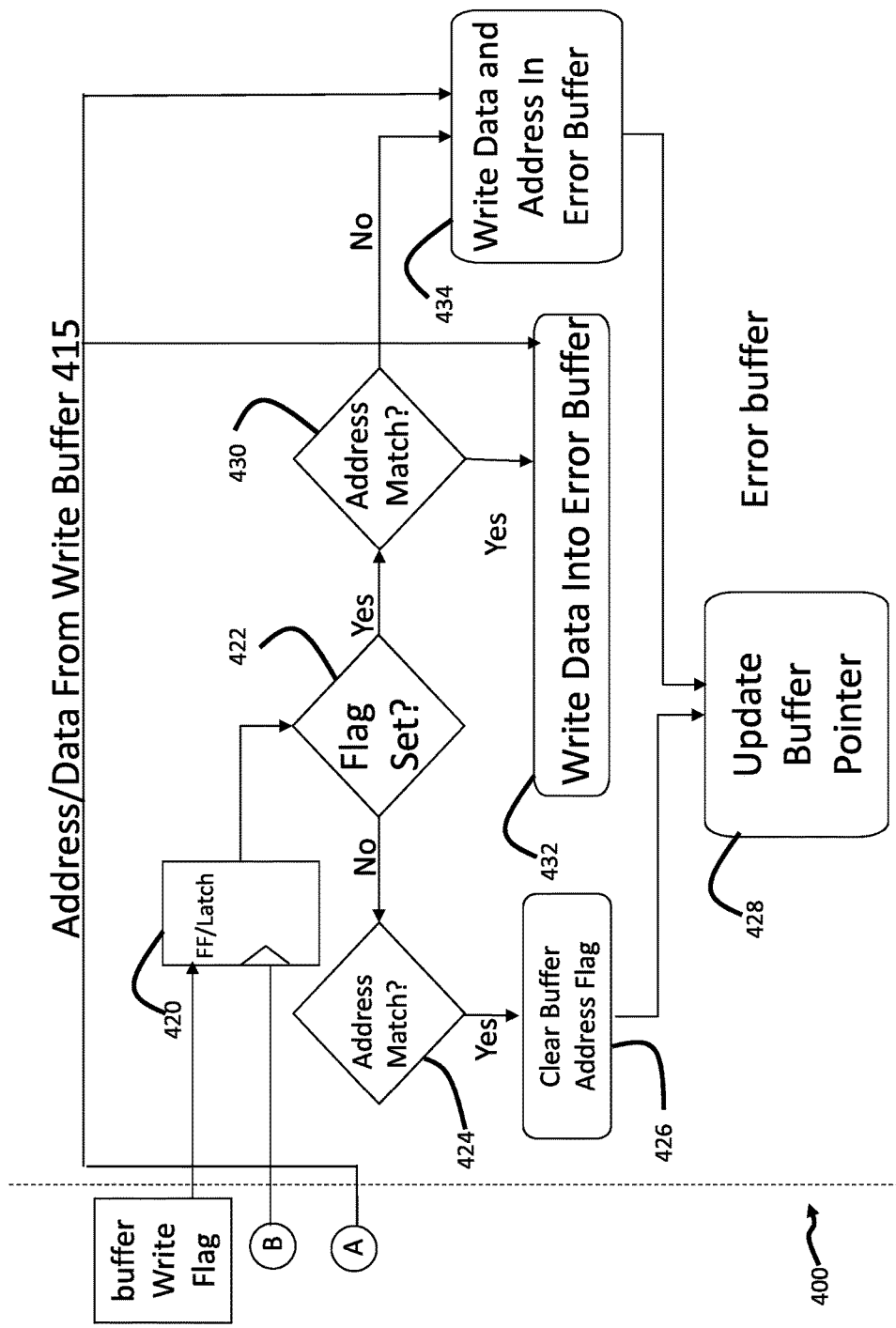

A detailed flow chart of a write operation 400 for an STT-MRAM device having an error buffer 120 is shown in FIGS. 4A-4B. FIGS. 4A-4B also shows how an embodiment of memory control logic 125 operates. When a write cycle is initiated, the data and any ECC bits, arranged as a data word, and the address for that data are input on ADDR/DATA line 402 while clock and write enable signals are input on CLK/WE line 404. The data is then written to an address in the MRAM array in step 406. At step 408, the data written to the MRAM is verified in the manner discussed above with respect to FIG. 2 (steps 204-208). If the verification step 408 demonstrates that the data written to the memory array 105 is within the predetermined error budget for the device 100 (step 410), a buffer write flag is reset (e.g., cleared) (step 412). On the other hand, if the verification step 408 determines that the data written to memory array 105 does not meet the error budget, e.g., the verification has failed (step 410), the method sets the buffer write flag (step 416). In this embodiment, the verification step may be performed by memory control logic 125. The manner in which the buffer write flag is used in the device will be discussed below. Concurrently with writing to the memory array 105, at step 414, address and data input on ADDR/DATA line 402 are also latched into latches within write buffer 415. Write buffer 415 is clocked by the clock signal on the CLK/WE line 404, as is the memory array 105, as is seen in FIG. 4A.

In one embodiment, the buffer write flag is latched into latch 420 on the next cycle of the clock signal on CLK/WE line 404, as shown in FIG. 4B. In other embodiments, buffer write flag may be latched on the same clock cycle. In either case, the method determines, at step 422, whether the buffer write flag has been set (see steps 412 and 416). If the buffer write flag has not been set, step 424 of the method determines whether the address of the data written to the memory array 105 on the previous cycle matches an address previously written into the error buffer 120 at step 406. If the address of the data just written into memory array 105 matches an address previously written into error buffer 120, that address flag in error buffer 120 is cleared, at step 426. This is done because the data stored in the memory array 105 is within the error budget and thus this data need not be saved in error buffer 120. By clearing the address flag in the error buffer 120, the method ensures that a subsequent read operation for that address will output data stored in memory array 105 and not error buffer 120. After clearing the address flag in the error buffer 120, the buffer pointer of the error buffer 120 is updated (step 428).

Figure 6:
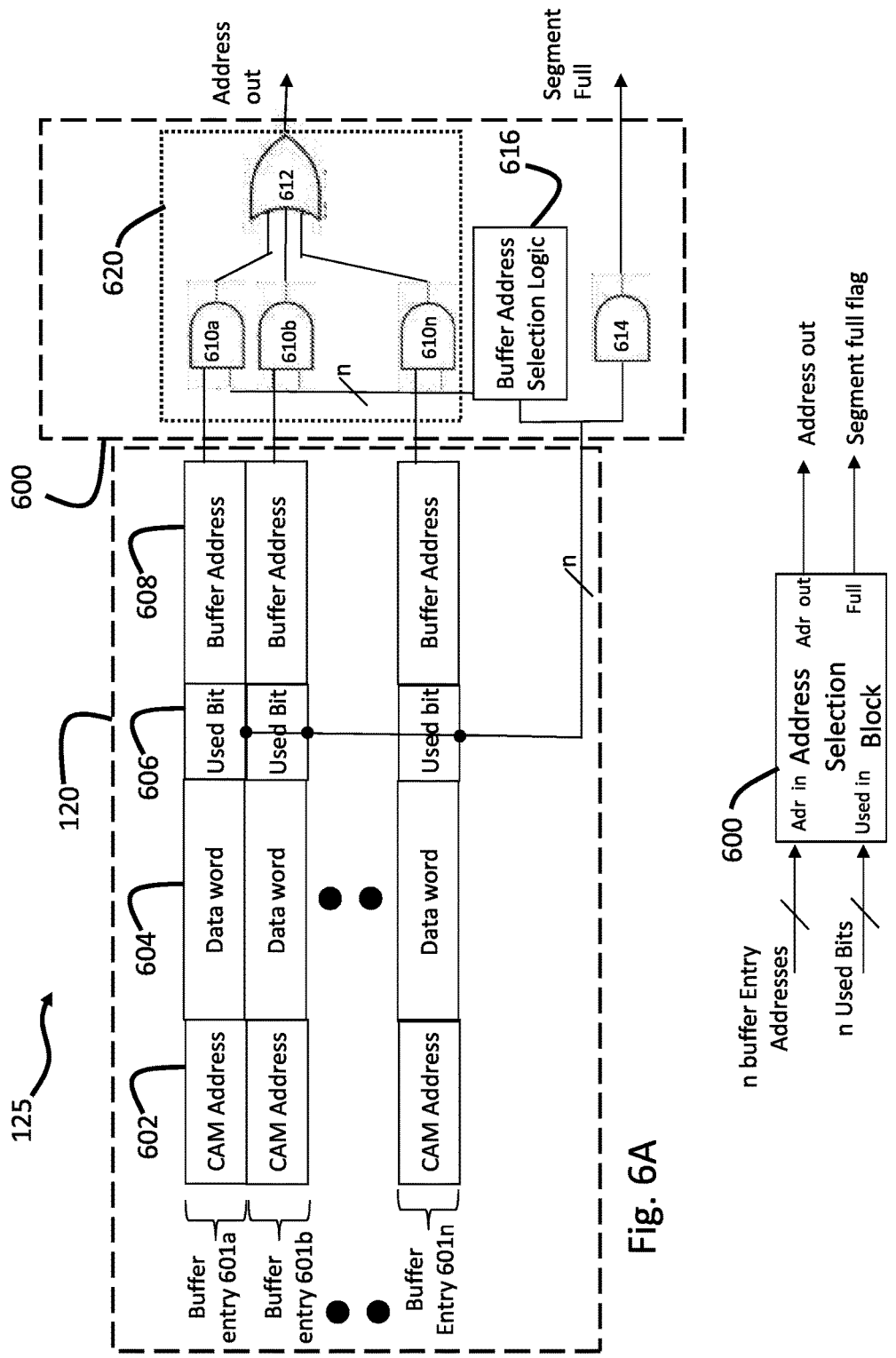
FIG. 6A is block diagram showing an embodiment of an error buffer block with an address selection block.
FIG. 6B is a simplified block diagram showing an embodiment of an error buffer block with an address selection block.

The buffer pointer generates an address within error buffer 120 where the word to be stored should be written on the next write cycle. The buffer pointer also should generate a flag indicative of when error buffer 120 is full. Because memory locations at specific addresses within error buffer 120 will be written to fairly often, it is preferred to keep track of addresses that are being used or addresses are available to store data. By updating the buffer pointer, method 400 can keep track of addresses that are being used as well as addresses that are available to store data. An embodiment of a buffer pointer in the form of an address selection block will be discussed in more detail below in the context of FIGS. 6-7.

If, at step 422, the method determines that a buffer write flag has been set, the method determines, at step 430, whether the address of the data that was supposed to be written to the memory array 105 at step 406 matches an address previously written into the error buffer 120. If the address of the data that was supposed to be written into memory array 105 matches an address previously written into error buffer 120, the method, at step 432, writes the data for that address into existing location within error buffer 120. On the other hand, if, at step 430, the method determines that the address of the data that was supposed to be written into memory array 105 at step 406 does not match an address previously written into error buffer 120, the method, at step 434, will write the address and data to be written to unoccupied location within the error buffer 120. Then, at step 428, the buffer pointer is updated. As is seen in FIG. 4B, the address and data stored in write buffer 415 is available to step 434.

By using method 400, data for a particular address may be stored in any of three potential memories. In particular, data can be stored in memory array 105, error buffer 120 and write buffer 115.

An embodiment of a read operation for an STT-MRAM device having an error buffer will now be discussed in the context of the embodiment shown in FIG. 5. During a memory read cycle, the STT memory will be read, and the error buffer 120 and memory buffer 115 will be searched for address hit. Data from one of the memory array 105, write buffer 115, or error buffer 120 are output through a multiplexer 530. As will be seen, the method implements a hierarchy to determine which data stored on device 100 should be read. A hierarchy is used because data can be stored in the memory array 105, write buffer 115, and error buffer 120, but only the memory resource containing the correct data should be output. In an embodiment, the first priority in the hierarchy is data stored in the write buffer 115. The second priority in the hierarchy is data stored in the error buffer 120. The third priority in the hierarchy is data stored in the memory array 105, which is processed in the ECC block 110 (if present) prior to output.

Figure 5:
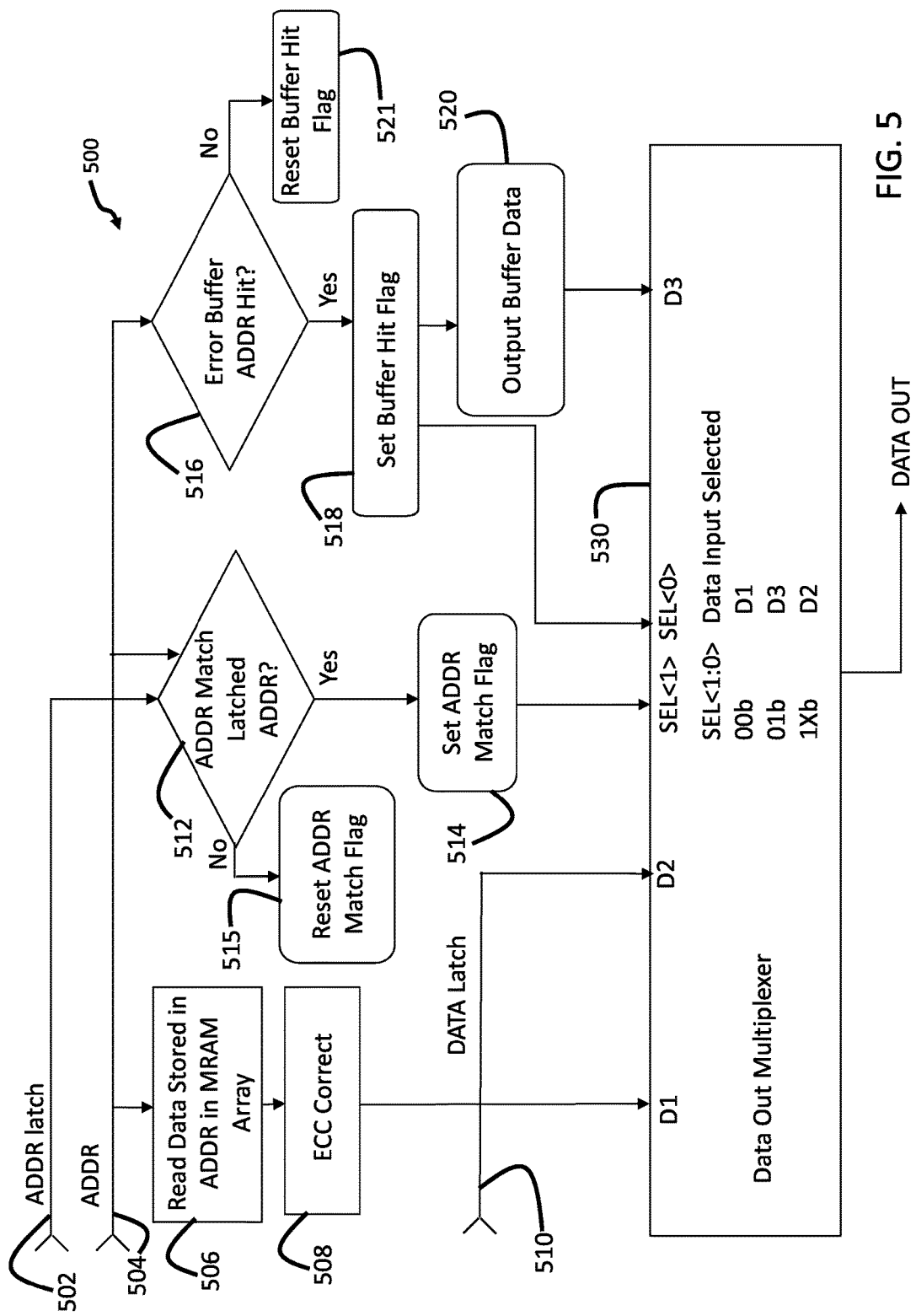
FIG. 5 is a flow-chart showing the method for reading data from an STT-MRAM device that utilizes an error buffer.

A flow chart showing an exemplary method 500 for reading data from an STT-MRAM device 100 incorporating an error buffer 120 is shown in FIG. 5. When a read operation is initiated, an address is placed on ADDR line 504. The address on ADDR line 504 is provided to the memory array 105, the write buffer 115 and error buffer 120. As seen in FIG. 5, when device 100 receives an address, the read method 500 reads the data stored at the specified address in the MRAM array (step 506). The data read from memory array 105 is provided to ECC block 110 for error correction (step 508), and is then provided to data input D1 on data out multiplexer 530.

In addition, during a read operation, the method 500, at step 512, determines if the address on ADDR line 504 matches the address stored in write buffer 115. At step 514, if the address on ADDR line 504 matches the address stored in the address latches of write buffer 115, an address match flag is set. Conversely, if the address on ADDR line 504 does not match the address stored in the address latches of write buffer 115, the address match flag is reset. The state of the address match flag is provided to select input SEL<1> on data out multiplexer 530. Note that the data stored in the write buffer 115 is provided to data input D2 on data out multiplexer 530.

Finally, during read operation 500, the method 500 at step 516, determines if the address on ADDR line 504 matches an address in error buffer 120. At step 518, if the address on ADDR Line 504 matches an address stored in error buffer 120, a buffer hit flag is set. Conversely, if the address on ADDR line 504 does not match the address stored in the error buffer 120, the buffer hit flag is reset. The state of the buffer hit flag is provided to select input SEL<0> on data out multiplexer 530. At step 520, the data stored in error buffer 120 at the address on ADDR line 504 is provided to data input D3 on data out multiplexer 530.

Data out multiplexer 530 can be used to output error-free data from STT-MRAM device 100, and its control logic determines the priority hierarchy. As discussed, data out multiplexer 530 has a data input D1 that receives data from memory array 105, data input D2 that receives data from write buffer 115 and data input D3 that receives data from error buffer 120. Likewise, data out multiplexer 530 has two select inputs that control which data from inputs D1, D2 and D3 is placed on its DATA OUT. Select input SEL<1> receives an address match flag that indicates if the read address matches an address for data stored in write buffer 115. Select input SEL<0> receives a buffer hit flag that indicates if the read address matches an address for data stored in error buffer 120.

As seen in FIG. 5, if both the address match flag and buffer hit flag are reset, such that a logic "0" is placed on both the select input SEL<1> and the select input SEL<0>, the data out multiplexer 530 will output the error corrected data stored in the selected address of memory array 105. If buffer hit flag is set but the address match flag is reset such that a logic "1" is placed on the select input SEL<0> and a logic "0" is placed on the select input SEL<1>, the data out multiplexer 530 will output the data stored in error buffer 120 for the selected address. Finally, if the address match flag is set, it does not matter whether the buffer hit flag is set or reset since the data out multiplexer will always output the data stored in the write buffer 115 that were input on DATA Latch line 510. Table I shows the select input logic that establishes this priority hierarchy:

TABLE I

| SEL<1> | SEL<0> | Selected Data Input |
| --- | --- | --- |
| 0 | 0 | D1 (From Memory Array 105) |
| 0 | 1 | D3 (From Error Buffer 120) |
| 1 | X (Don't Care) | D2 (From Write buffer 115) |

As seen in Table I, whenever the address match flag is set (e.g., set as a "1"), data out multiplexer 530 will always output the data stored in the write buffer 115. Thus, the data stored in the write buffer 115 has the highest priority in the hierarchy. Likewise, if the buffer hit flag is set (e.g., set as a "1") but the address match flag is not set (e.g., a "0"), data stored in error buffer 120 will be output. Thus, the data stored in the error buffer 120 has the next-highest priority in the hierarchy. Finally, if neither address match flag nor buffer hit flag are set, then data stored in the memory array 105 will be output. Thus, data stored in the memory array 105 has the lowest priority in the hierarchy.

Figure 7:
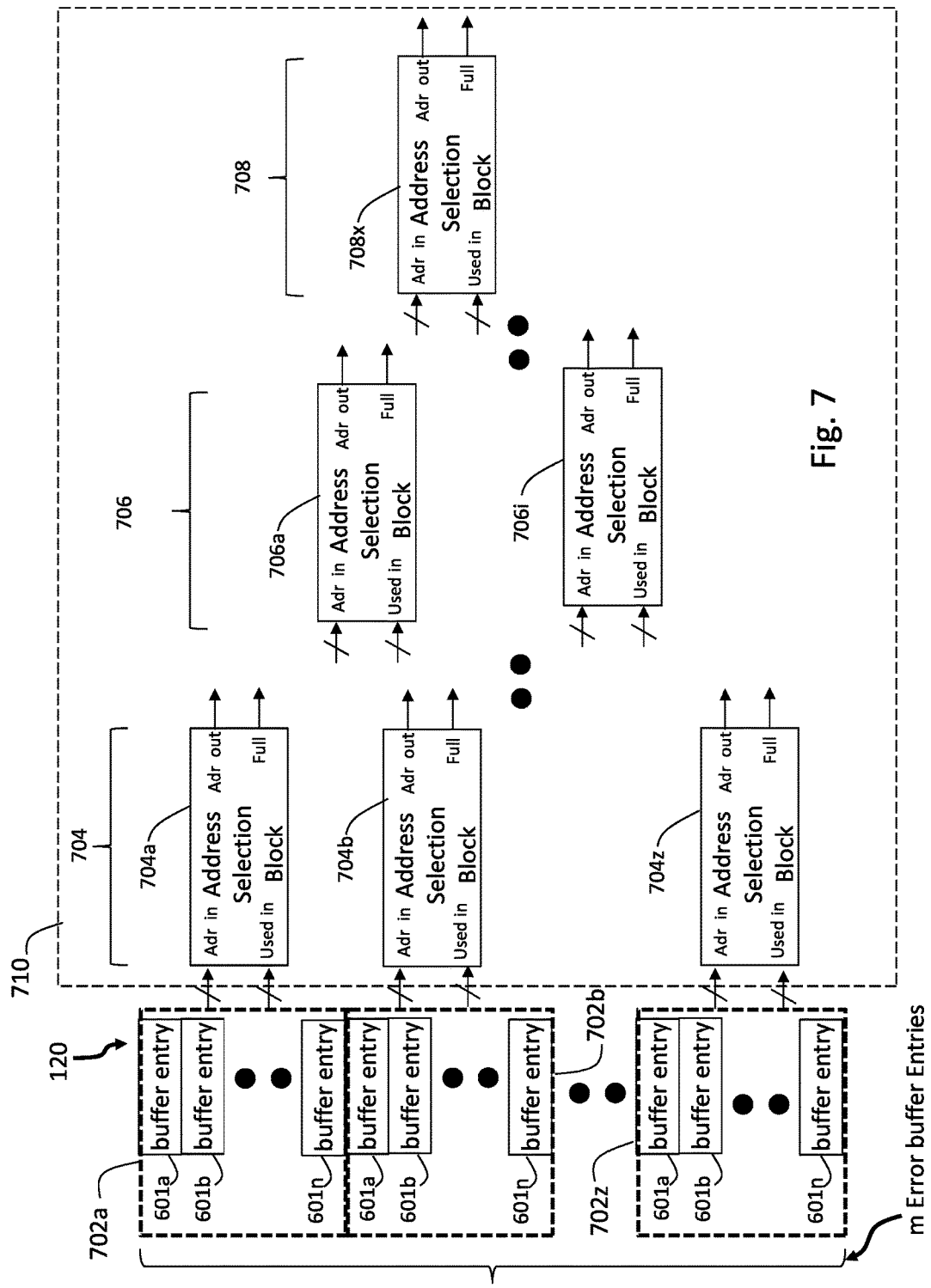
FIG. 7 is also a block diagram showing an embodiment of a segmented error buffer having address selection blocks.

An exemplary memory control logic block 125, including address selection block 600, for use with error buffer 120 will be discussed in the context of FIGS. 6A, 6B and 7. Error buffer 120 includes a plurality of n buffer entries 601a, 601b . . . 601n for storing data words that failed to write in memory array 105 within the allowable ECC budget. The number n of buffer entries can be selected to take into account the bit error rates of the MRAM array such that the number of entries closely matches the expected need for error buffer entries. As seen in FIG. 6A, each entry 601a, 601b . . . 601n in error buffer 120 can have several fields. In the exemplary embodiment shown in FIG. 6A, each error buffer entry 601a, 601b . . . 601n has a content addressable memory ("CAM") address field 602, a data word field 604, a used bit field 606 and a buffer address field 608.

CAM address field 602 of each entry 601a, 601b . . . 601n stores the address in the memory array 105 where the data that failed to write within the ECC error budget was written. Thus, CAM address field 602 contains an address corresponding to the memory location within memory array 105 containing a data word that cannot be satisfactorily corrected using error correction. Data word field 604 of each entry 601a, 601b . . . 601n stores the data associated with CAM address 602. Used bit field 606 contains a flag indicating whether this particular address within error buffer 120 presently contains a valid data word, i.e., that data word 604 is to be read instead of either the data word stored in memory array 105 or write buffer 115. Finally, buffer address field 608 contains the address in error buffer 120 for a particular error buffer entry 600a, 600b . . . or 600n.

Memory control logic 125 must determine which address 608 within error buffer 120 to write data word that failed to write in the memory array 105 within the error budget. In the embodiment shown in FIG. 6A, address selection block 600 performs this function, although other implementations can be used without departing from the concepts described herein. Note that in its simplest form, buffer address selection block 600 also acts as a buffer pointer, although as will be discussed in more detail, a grouping of address selection blocks will comprise a buffer pointer. As discussed, each error buffer entry 601a, 601b . . . 601n has a used bit field 606 that stores a flag indicating whether the data stored in the data word field 604 is valid. In this embodiment, used bit field 606 stores a logic "1" if the error buffer entry 601a, 601b . . . 601n contains valid data. Likewise, in this embodiment, used bit field 606 stores a logic "0" if the error buffer entry does not contain valid data. All of the n values stored in used bit field 606 for each of the n error buffer entries 601a, 601b . . . 601n are input to AND gate 614 or other block that performs a logic AND operation, or even an OR operation if appropriate. If all the values stored in the used bit fields 606 of error buffer entries 601a, 601b . . . 601n are set to logic "1" because all entries are used, AND gate 614 will output a "segment full" flag indicating that the error buffer 120 (or an error buffer segment, to be discussed below) is full and cannot have any further data words stored therein. Likewise, if any of the used bit fields 606 in error buffer entries 601a, 601b . . . 601n is not set, AND gate 614 will output logic "0," thus indicating that the segment full flag is not set.

Address selection block 600 further comprises buffer address selection logic block that determines which of the buffer entries 601a, 601b . . . 601n that are available to store data words should be written to. Buffer address selection logic block 616 has n outputs, i.e., the same number of outputs as there are buffer entries 601a, 601b . . . 601n. Different strategies can be used to determine which of the available buffer entries 601a, 601b . . . 601n should be the next written entry. For example, buffer address selection logic 616 can operate by selecting the lowest address available for storing the next data word to be written to error buffer 120. Another strategy selects the highest address available for storing the next data word to be written to error buffer 120. Yet another strategy attempts to ensure that each buffer entry 601a, 601b . . . 601n in the error buffer 120 have substantially the same number of write cycles over the life of the device 100. This may be important if MRAM cells are used as memory elements in error buffer 120, since MRAM cells may have a limited number of write cycles before they no longer can reliably store data. Such a strategy thus takes memory cell endurance into account. This is done by tracking the number of write cycles a particular buffer entry 601a, 601b . . . 601n has experienced, and selecting a particular buffer entry 601a, 601b . . . 601n for writing that has experienced fewer write cycles than other such buffer entries 601a, 601b . . . 601n. To store such information (e.g., number of write cycles, last written address, etc.), buffer address selection logic can include memory. In an embodiment, buffer address selection logic includes nonvolatile memory so that information needed to determine which addresses in memory array 105 have been written is available after device 100 is loses power.

Address selection block 600 further includes a multiplexer 620. Multiplexer 620 can comprise AND gates 610a, 601b . . . 601n that feed an OR gate 612. One of the inputs to each AND gate 610a, 601b . . . 601n is the buffer address 608 for a corresponding buffer entry 601a, 601b . . . 601n. The other input to each AND gate 610a, 601b . . . 601n is one of then outputs of the buffer address selection logic block 616. These n outputs of the buffer address selection logic block 616 acts as the select inputs for multiplexer 620. Thus, buffer address selection logic block 616 determines the address that that will be output from multiplexer 620.

FIG. 6B shows a simplified block diagram of address selection block 600, and shows that address selection block 600 receives n buffer addresses and n used bit flags, i.e., one buffer address 608 and used bit 606 for every buffer entry 601a, 601b . . . 601c. Address selection block 600 outputs the address where the data word will be written into error buffer, as well as a segment full flag. The simplified block diagram for address selection block 600 will be used in discussing FIG. 7.

Error buffer 120 can be divided into error buffer segments, with each error buffer segment containing a predetermined number of n buffer entries. The use of error buffer segments provides certain advantages, which will be discussed below. An exemplary architecture that divides buffer entries into error buffer segments will be discussed in the context of FIG. 7. As is seen, an error buffer 120 that has m addresses and thus m buffer entries. The buffer entries are divided into a certain number error buffer segments 702a, 702b . . . 702z. Each of the segments 702a, 702b . . . 702z has n buffer entries 601a, 601b . . . 601n. In this embodiment, each segment 702a, 702b . . . 702z has the same number, n, of buffer entries 601a, 601b . . . 601n.

In an error buffer 120 comprised of error buffer segments 702a, 702b . . . 702z, a buffer pointer 710 is formed a multiple stages of address selection blocks. As is seen in FIG. 7, each error buffer segment 702a, 702b . . . 702z is coupled to a corresponding address selection block 704a, 704b . . . 704z within buffer pointer 710. Because the m error buffer entries are divided into error buffer segments 702a, 702b . . . 702z, and each error buffer segment 702a, 702b . . . 702z outputs addresses 608 and used bit flags 606 to a corresponding address selection block 704a, 704b . . . 704z, the buffer pointer 710 can use multiple stages of address selection blocks. The number of stages is determined by the formula $Ln(m)/Ln(n)$ stages. Thus, an embodiment where m (i.e., the total number of buffer entries) is twelve and n (i.e., the number of error buffer entries in each error buffer segment) is set to four, the error buffer pointer 710 will have three stages.

In one embodiment, error buffer 120 may be segmented in a way that mirrors the manner in which the data words in memory array 105 will be segmented (the manner in which the data words within the memory array 105 is segmented is not shown). In this way, when a memory segment within the memory array 105 is idle or busy, it's associated error buffer segment 702a, 702b . . . 702z is likewise idle or busy. Thus, when an error buffer segment 702a, 702b . . . 702z is idle, the data in the error buffer 120 may be flushed (i.e., written) to data words within the memory array 105. This can free up the buffer to accept more data entries at a future time. Similarly, if an error buffer segment 702a, 702b . . . 702z is either full or nearly full, while the memory or associated memory segment is busy, memory control logic 125 may force an interrupt to flush buffer data to STT to free up buffer locations.

Thus, as is seen, buffer pointer 710 within memory control logic 125 will keep track of the number of available buffer locations in each buffer segment. If the buffer 120 or a buffer segment 702a, 702b . . . 702z is nearly full, and the memory or associated memory segment is busy, memory control logic may force an interrupt to flush buffer data to the memory array 105 to free up buffer locations.

The embodiments described herein provide significant advantages. As discussed, STT-MRAM devices have an intrinsic (raw) bit write error rate (RBER). If the RBER is greater than the error rate target for a given application, an ECC error correction scheme may be used to improve performance to the level required. This target may vary by application. For static random access memory (SRAM) replacement, a typical post-ECC WER target is 1E-15. In one example, for the architecture given in the example, a RBER>2E-7 is required. For the same architecture with the error buffer, the RBER must only be >1E-3. This represents a significant relaxation in the required error rate. Alternatively, it allows for the use of lower degree of error correction that would otherwise be necessary. Use of lower degree of error correction requires less memory array, and smaller, less complex, faster, and lower power ECC encoder/decoder blocks.

As discussed, error buffer block 120 can be constructed using various memory technologies, including but not limited to STT-MRAM and other volatile and nonvolatile memory technologies. Error buffer block 120 should have sufficient storage to store user data, ECC bits, status bits and enable bits. Error buffer block 120 is preferably designed to meet the overall write error rate (WER) target of the device. Since data is stored in STT-MRAM, data must be stored with high-reliability. To do so, the STT-MRAM used in this embodiment of the error buffer block 120 can be coupled to an enhanced ECC block (not shown) that is computationally able to correct write errors with high efficiency and speed.

This would require a sufficient number of ECC bits to improve the WER of the error buffer so that the WER of the error buffer matches or exceeds the WER of the memory device itself. One example of such an error correction strategy would be use what is known as multiple copy voting error correction. While such an error correction strategy is very powerful and is known to be simple, the circuitry needed for implementation is typically larger than ECC strategies. Moreover, such multiple copy voting error correction typically uses more memory cells than ECC implementations.

In another embodiment, the error buffer block 120 comprises SRAM memory cells with non-volatile memory, e.g., non-volatile variants of STT-MRAM, backup. In such an embodiment, the buffer is built from SRAM volatile memory, and downloaded into a non-volatile memory block (either a separate non-volatile memory block, or the memory array 105) when a power down condition is detected. The data in the STT would then be uploaded back into SRAM on power up. This has advantages of low power, high speed reliable operation inherent to SRAM, but has disadvantage that downloading the data on power down may be a long operation. If power down is sudden, there may not be enough time, which could lead to data loss.

In yet another embodiment, on each write cycle, an MRAM device could write data words simultaneously to both error buffer block 120 and memory array 105. This approach would use more average power since it would be necessary to write the buffer on each write cycle instead of only writing when the STT-MRAM write cycle has failed (i.e., that the data written to memory array 105 did not meet the error budget of the device).

In another embodiment, an MRAM device in accordance with this patent document's teachings will not empty the contents of the error buffer 120 except when data is flushed to the MRAM array during memory idle time.

In yet another embodiment, if a particular error buffer segment 702a, 702b . . . 702z becomes full, the mapping of buffer entries to error buffer segment 702a, 702b . . . 702z could be changed so that the full error buffer segment 702a, 702b . . . 702z can use (e.g., "borrow") error buffer segments from another error buffer segment that are not full. Such dynamic mapping of error buffer entries increases the flexibility of the error buffer.

Figure 8:
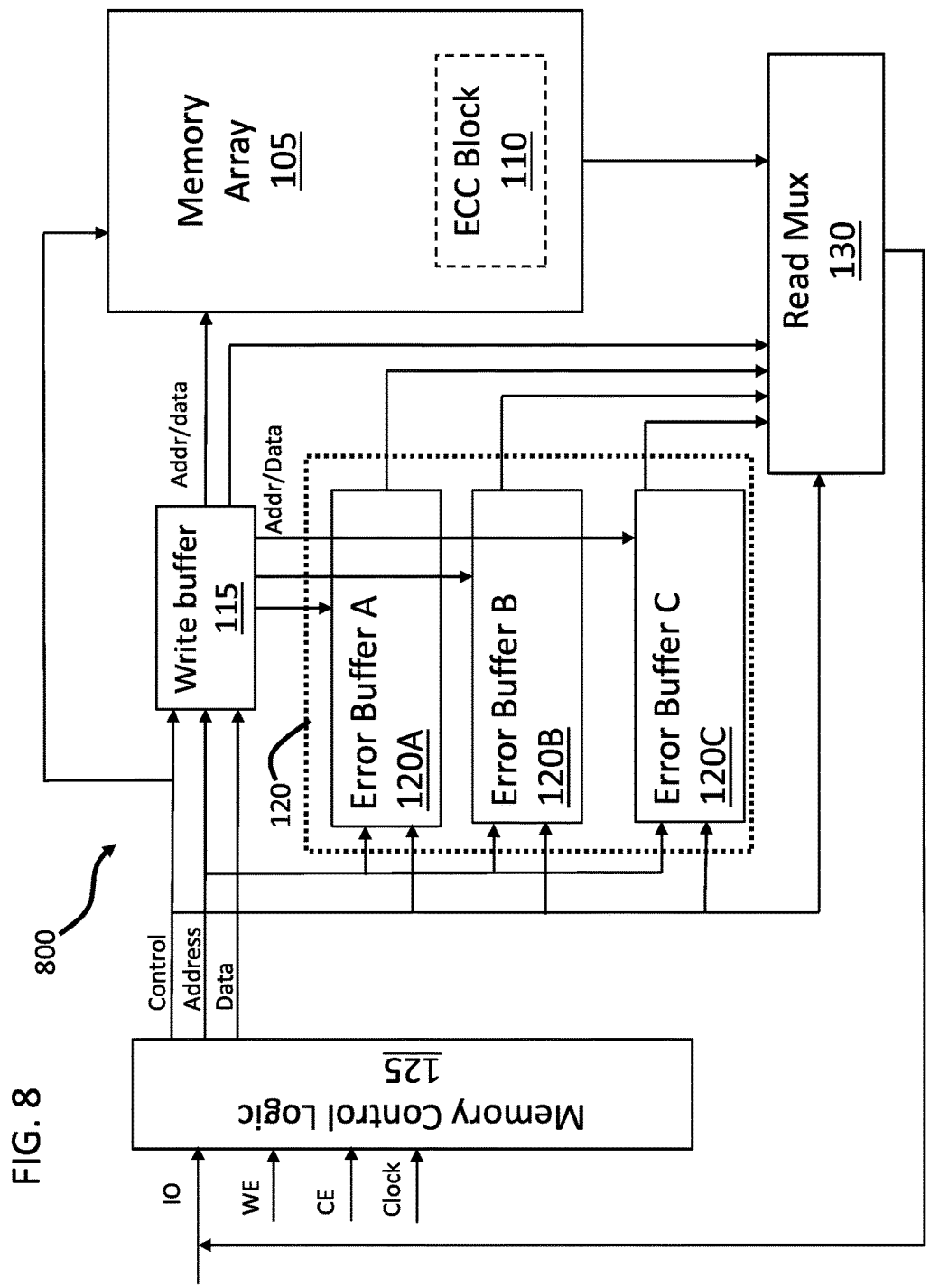
FIG. 8 is a block diagram of an STT-MRAM device with multiple error buffer memory blocks.

FIG. 8 is a block diagram showing an alternative embodiment for a memory device 800 that has an error buffer block 120 comprised of a primary error buffer block, error buffer block A 120A, and at least one secondary error buffer block, error buffer block B 120B, and potentially, additional secondary error buffer blocks, e.g., secondary error buffer block C 120C. Use of a primary error buffer block, e.g., error buffer block A 120A and one or more secondary error buffer blocks, e.g., error buffer block B 120B and error buffer block C 120C, allows a data word that fails to write into error buffer block A 120A within a predefined error budget to be written to memory cells in secondary error buffer block B 120B. Likewise, if additional secondary error buffer blocks are present, and for example, the data word did not write into secondary error buffer block B 120B within a predefined error budget, the data word can be written into yet another secondary error buffer block, e.g., secondary error buffer block C 120C.

Thus, when a data word is not written into memory array 105 within the error budget of the device, the address and data word are written from write buffer block 115 into error buffer block A 120A. If memory control logic block 125 determines that the write operation into error buffer block A 120A failed, i.e., did not write the data within the error budget, memory control logic block 125 will write the data word and address in write buffer block 115 into error buffer block B 120B. If additional secondary error buffer blocks are present, they can be utilized as well. Thus, in the embodiment shown in FIG. 8, if the write operation to write data into error buffer block B 120B failed (i.e., write operation did not write within the error budget), the memory control logic block 125 can write the data stored in write buffer block 115 into error buffer block C 120C. As can be seen use of multiple error buffer blocks further reduces the impact of write errors of a memory device.

Note that in an alternative embodiment, the primary error buffer block A 120A and the secondary error buffer blocks, error buffer block B 120B and error buffer block C 120C, can operate in parallel, in that the data words that fail to write into memory array 105 can be read into all error buffer blocks 120A, 120B . . . 120C at approximately the same time, rather than performing write operations for secondary error buffer blocks after previous write attempts into write buffer blocks higher in the hierarchy failed.

In all other respects, this embodiment of memory device 800 is similar to memory device 100 shown in FIG. 1. The discussion regarding the components of memory device 800 that are similar to those in memory device 100 will not be repeated.

Use of an error buffer block 120 comprised of a primary error buffer block 120A and at least one secondary error buffer block 120B, 120C can provide certain advantages. For example, it is possible that the memory technology used as memory cells for error buffer block 120 might have a stochastic write mechanism that could be prone to write errors just as the memory cells of memory array 105. Thus, data words may fail to write correctly in error buffer block 120 just as they failed to write correctly in memory array 105. A way to reduce the WER of error buffer block 120 is to use multiple error buffer blocks, e.g., error buffer blocks 120A, 120B . . . 120C instead of a single error buffer block 120. Thus, just as with write operations to memory array 105, it is possible to compare the data actually written into primary error buffer block 120A to what was supposed to be written to see if the write operation took place within a predefined error budget. If the data word was not written to primary error buffer block 120A within the predefined error budget, the data word can be written to a secondary error buffer block 120B. Likewise, should the data word written to secondary error buffer block 120B not be written within a predefined error budget, the data word can subsequently be written to an additional secondary error buffer block 120C.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A random access memory (RAM) device, comprising
   a memory array comprised of an array of MRAM storage elements arranged as a plurality of data words, wherein each of the plurality of data words comprises an address;
   address and data lines, coupled to the memory array, wherein the data lines carry a data word to be written into the memory array and the address lines carry a corresponding address;

a write buffer, coupled to the address and data lines, wherein the write buffer comprises a number of storage elements, and wherein the write buffer stores the data word and the corresponding address carried on the address and data lines during a write cycle;

an error buffer, coupled to the write buffer, wherein the error buffer comprises a plurality of entries, wherein each of the error buffer entries comprises a plurality of storage elements and an associated buffer memory address; and a memory control logic that operates during a read cycle and the write cycle, wherein the memory control logic, during the write cycle, is operable to determine whether the data word was written into the memory array within a predefined error budget, and wherein the memory control logic writes the data word and the corresponding address from the write buffer into a selected one of the plurality of entries of the error buffer if the data word was not written into the memory array within the predefined error budget, and wherein the memory control logic, during a read cycle, is further operable to determine whether an address to be read is stored in the write buffer, the error buffer or the memory array.

2. The RAM device of claim 1, wherein the number of storage elements of the write buffer corresponds to a number of bits in the data word and the corresponding address to be written.

3. The RAM device of claim 2, wherein each of the number of storage elements of the write buffer comprises a respective latch.

4. The RAM device of claim 2, wherein each of the number of storage elements of the write buffer comprises a respective static random access memory cell.

5. The RAM device of claim 1 wherein the memory control logic comprises an address selection block operable to determine which of the plurality of entries in the error buffer to store the data word and the corresponding address of the data word.

6. The RAM device of claim 5, wherein the address selection block comprises buffer address selection logic operable to determine which of the plurality of entries in the error buffer to store the data word and the corresponding address of the data word.

7. The RAM device of claim 6, wherein the buffer address selection logic is operable to select one of the plurality of entries having a lowest value for the associated buffer memory address.

8. The RAM device of claim 6, wherein the buffer address selection logic is operable to select one of the plurality of entries having a highest value for the associated buffer memory address.

9. The RAM device of claim 6, wherein the buffer address selection logic is operable to track a number of write cycles experienced by each of the plurality of storage elements in the error buffer, and wherein the buffer address selection logic is operable to select one of the plurality of entries having fewer write cycles as compared to other of the plurality of entries.

10. The RAM device of claim 5 wherein the address selection block is operable to keep track of which of the plurality of entries has data stored therein.

11. The RAM device of claim 10 wherein the address selection block is operable to select one of the plurality of entries that is vacant for storing the data word and the corresponding address of the data word.

12. The RAM device of claim 1 wherein each of the plurality of storage elements of the error buffer comprise MRAM memory cells.

13. The RAM device of claim 1 wherein each of the plurality of storage elements of the error buffer comprise flash memory cells.

14. The RAM device of claim 1, wherein each of the plurality of storage elements of the error buffer comprise volatile memory cells.

15. The RAM device of claim 1, wherein the plurality of data words further comprise error correction code bits.

16. The RAM device of claim 15 wherein the error correction code bits are of sufficient number to cause the error buffer to have a write error rate that matches or exceeds a target write error rate (WER) of the RAM device.

17. The RAM device of claim 1 wherein the error buffer comprises: a primary error buffer; and a secondary error buffer, wherein the primary error buffer is operable to have written therein the data word and the corresponding address of the data word into a selected one of a plurality of entries of the primary error buffer if the data word was not written into the memory array within the predefined error budget, and wherein the secondary error buffer is operable to have written therein the data word and the corresponding address of the data word into a selected one of a plurality of entries of the secondary error buffer if the data word was not written into the primary error buffer within the predefined error budget.

18. A method for writing data into a memory device, the method comprising:

writing a data word into memory cells of the memory device at a selected one of a plurality of memory addresses to store the data word in the memory device, wherein the memory device comprises the plurality of memory addresses, wherein each of the memory cells is operable to store a data word at a selected one of the plurality of memory addresses;

storing the data word and the selected one of the plurality of memory addresses in a write buffer;

reading the data word written to the memory device;

comparing the data word written during the writing to the data word that was read during the reading;

determining whether any differences from the comparing are within an allowable error budget; and if the differences are not within a predetermined error budget, writing the data word and the selected one of the plurality of memory addresses to a selected one of a plurality of buffer entries within an error buffer, wherein the writing comprises:

determining which of the plurality of buffer entries is available for storing of the data word;

selecting one of the plurality of buffer entries that is available for storing of the data word; and writing the data word into the buffer entry selected during the selecting; and while a first portion of the memory device is not undergoing either a write cycle or a read cycle, writing the data word stored in the selected one of the plurality of buffer entries within an error buffer into memory cells of the first portion of the memory device.

19. The method of claim 18, wherein the selecting comprises:

determining a number of write cycles memory cells of the plurality of buffer entries within the error buffer have previously incurred; and writing the data word into a buffer entry containing memory cells that have had fewer write cycles as compared with other of the plurality of buffer entries.

20. The method of claim 18, wherein the writing the data word to the selected one of a plurality of buffer entries within the error buffer further comprises:

selecting one of the plurality of buffer entries that has a numerical address value that is higher than any other numerical address value of the plurality of buffer entries that is available for storing of the data word.

21. The method of claim 18, wherein if the differences are within the predetermined error budget, clearing any data word written into a particular buffer entry corresponding to the selected one of the plurality of memory addresses.

22. The method of claim 18, further comprising:

receiving a read request, the read request including a read address;

determining whether the read address matches the selected one of the plurality of memory addresses stored in the write buffer;

determining whether the read address matches the selected one of the plurality of memory addresses stored in any of the plurality of buffer entries within the error buffer;

if the read address matches the selected one of the plurality of memory addresses stored in the write buffer, outputting the data word stored in the write buffer;

if the read address does not match the selected one of the plurality of memory addresses stored in the write buffer, but does match the selected one of the plurality of memory addresses stored in any of the plurality of buffer entries within the error buffer, outputting the data word stored within the selected one of a plurality of buffer entries within an error buffer; and if the read address does not match either the selected one of the plurality of memory addresses stored in the write buffer or the selected one of the plurality of memory addresses stored in any of the plurality of buffer entries within the error buffer, outputting the data word stored within the memory cells of the memory device at the read address.

* * * * *